(12) United States Patent
Bae

(10) Patent No.: US 6,182,254 B1
(45) Date of Patent: Jan. 30, 2001

(54) RAMBUS ASIC HAVING HIGH SPEED TESTING FUNCTION AND TESTING METHOD THEREOF

(75) Inventor: Jeong Hwan Bae, Kyungki-do (KR)

(73) Assignee: Hyundai Electronics Industries Co., Ltd., Ichon (JP)

( * ) Notice: Under 35 U.S.C. 154(b), the term of this patent shall be extended for 0 days.

(21) Appl. No.: 09/144,073

(22) Filed: Aug. 31, 1998

(30) Foreign Application Priority Data

Jan. 26, 1998 (KR) .................................................... 98-2330

(51) Int. Cl.[7] .................................................. G11C 29/00
(52) U.S. Cl. ............................................................ 714/718
(58) Field of Search ........................... 714/718; 365/201, 365/202; 324/73.1

(56) References Cited

U.S. PATENT DOCUMENTS

| | | | |
|---|---|---|---|
| 5,606,717 | 2/1997 | Farmwald et al. | 710/36 |
| 5,638,334 | 6/1997 | Farmwald et al. | 365/230.03 |

OTHER PUBLICATIONS

Rambus Inc., Direct RAC Data Sheet, Rambus, p. 1 to 46, Aug. 1998.*
Gasbarro, The Rambus Memory System, IEEE, p. 94 to 96, May 1995.*
Gasbarro, Testing High Speed DRAMS, IEEE, p. 361, Feb. 1994.*

* cited by examiner

Primary Examiner—Albert DeCady
Assistant Examiner—Shelly A Chase
(74) Attorney, Agent, or Firm—Fleshner & Kim, LLP

(57) ABSTRACT

A Rambus ASIC having a high speed testing function and a testing method thereof are disclosed, in which a high speed test of 500MHz or greater is realized using a low frequency testing system. The Rambus ASIC having a high speed testing function includes a Rambus ASIC chip constituting a master device, which includes an RAC with a first data input/output speed, a Rambus DRAM constituting a slave device, a test comparator for driving or comparing data at a second speed lower than the first data input/output speed through each I/O pin in the Rambus ASIC chip, an operating clock supply part for supplying an operating clock to the RAC of the Rambus ASIC chip by varying the operating clock in data writing and reading under the control of the frequency of the test comparator, and a test logic part for outputting data input/output test signals to the test comparator by temporarily storing and comparing data writing/reading signals in the Rambus DRAM.

15 Claims, 5 Drawing Sheets

FIG.1
prior art
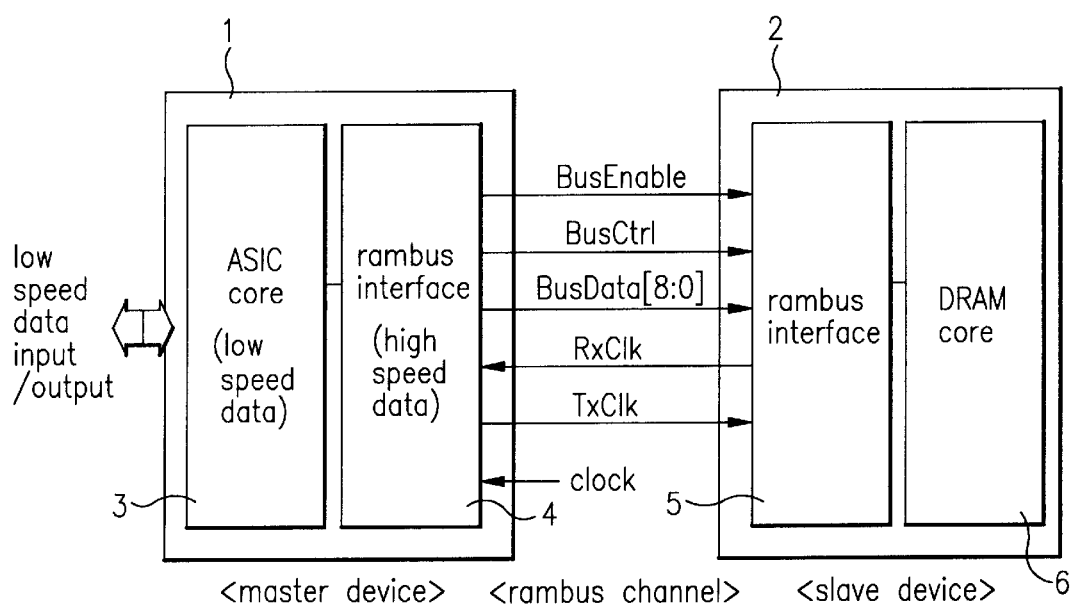

RAMBUS ASIC HAVING HIGH SPEED TESTING FUNCTION AND TESTING METHOD THEREOF

BACKGROUND OF THE INVENTION

1. Field of the Invention

The present invention relates to a Rambus application specific integrated circuit (ASIC), and more particularly, to a Rambus ASIC having a high speed testing function and a testing method thereof, in which a high speed test of 500MHz or greater is realized using a low frequency testing system.

2. Discussion of the Related Art

A conventional Rambus ASIC cell (RAC) will be described with reference to the accompanying drawings.

FIG. 1 is a schematic view illustrating a basic system of a Rambus memory. FIG. 2 is a schematic view illustrating a conventional Rambus ASIC chip and a testing circuit thereof.

As shown in FIG. 1, the basic system of a Rambus memory includes a master device, a Rambus channel, and a slave device.

In other words, the master device adopts an ASIC chip 1 constituting an ASIC core 3 and a Rambus interface 4, while the slave device adopts a Rambus DRAM (RDRAM) chip 2 constituting a Rambus interface 5 and a DRAM core 6. Data input/output between the Rambus interface 4 of the ASIC chip 1 and the Rambus interface 5 of the RDRAM chip 2 is performed at high speed, while data input/output in the ASIC core 3 is performed at low speed.

The master device has an RDRAM as a general ASIC chip and a Rambus ASIC cell (RAC) as a Rambus interface for high speed data input/output.

The RAC in the master device can perform transaction request for the RDRAM chip.

An ASIC device, a memory controller, a graphic engine, a microprocessor, and the like are examples of the master device.

The slave device always respond to request from the RAC of the master device.

The operation test of the Rambus memory system will be described below.

As shown in FIG. 2, for the operation test of the Rambus memory system, there is provided a high speed test equipment system 20 in a Rambus ASIC chip 10. The high speed test equipment system 20 drives or compares data at a speed of 500MHz or greater through each input/output (I/O) pin.

A data driver of the high speed test equipment system 20 applies a test pattern for operating an ASIC core 11 of the Rambus ASIC chip 10 to the ASIC core 11 through ASIC core input pins, and outputs data at a speed of 500MHz or greater through the RAC 12 from the ASIC core 11.

The data of 500MHz or greater is input to a comparative channel of the high speed test equipment system 20. The input data is compared with expected pattern data stored in a memory of the high speed test equipment system 20 and then tested.

High speed input/output test is performed to identify whether or not the Rambus ASIC chip 10 can output the data of 500MHz or greater through the RAC 12.

The conventional Rambus ASIC chip testing method has a problem that, to correspond to the high speed operation of the RAC of the Rambus ASIC chip, the high speed testing system is required, which increases the test cost in mass production of the Rambus ASIC chip, thereby reducing cost competition.

SUMMARY OF THE INVENTION

Accordingly, the present invention is directed to a Rambus ASIC having a high speed testing function and a testing method thereof that substantially obviates one or more of the problems due to limitations and disadvantages of the related art.

An object of the present invention is to provide a Rambus ASIC having a high speed testing function and a testing method thereof, in which a high speed test of 500MHz or greater is realized using a low frequency testing system.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a Rambus ASIC having a high speed testing function according to the present invention includes a Rambus ASIC chip constituting a master device, which includes an RAC with a first data input/output speed, a Rambus DRAM constituting a slave device, a test comparator for driving or comparing data at a second speed lower than the first data input/output speed through each I/O pin in the Rambus ASIC chip, an operating clock supply part for supplying an operating clock to the RAC of the Rambus ASIC chip by varying the operating clock in data writing and reading under the control of the frequency of the test comparator, and a test logic part for outputting data input/output test signals to the test comparator by temporarily storing and comparing data writing/reading signals in the Rambus DRAM.

In another aspect, a testing method of Rambus ASIC having a high speed testing function includes the steps of setting an operating clock to correspond to the maximum operation speed of an RAC under the control of a test comparator, writing certain data in a slave device and compressing the data to store in a test logic part, reading out the data written in the slave device and compressing the data to store in the test logic part, comparing the written data stored in the test logic part with the read out data stored in the test logic part, determining normal data input/output through the RAC if the two data values stored in the test logic part are the same as each other, and repeating said testing steps by lowering the clock frequency of a clock supply part at a certain level.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 shows a schematic and a timing chart of a basic system of a Rambus memory;

DETAILED DESCRIPTION OF THE PREFERRED EMBODIMENTS

Figure 2:
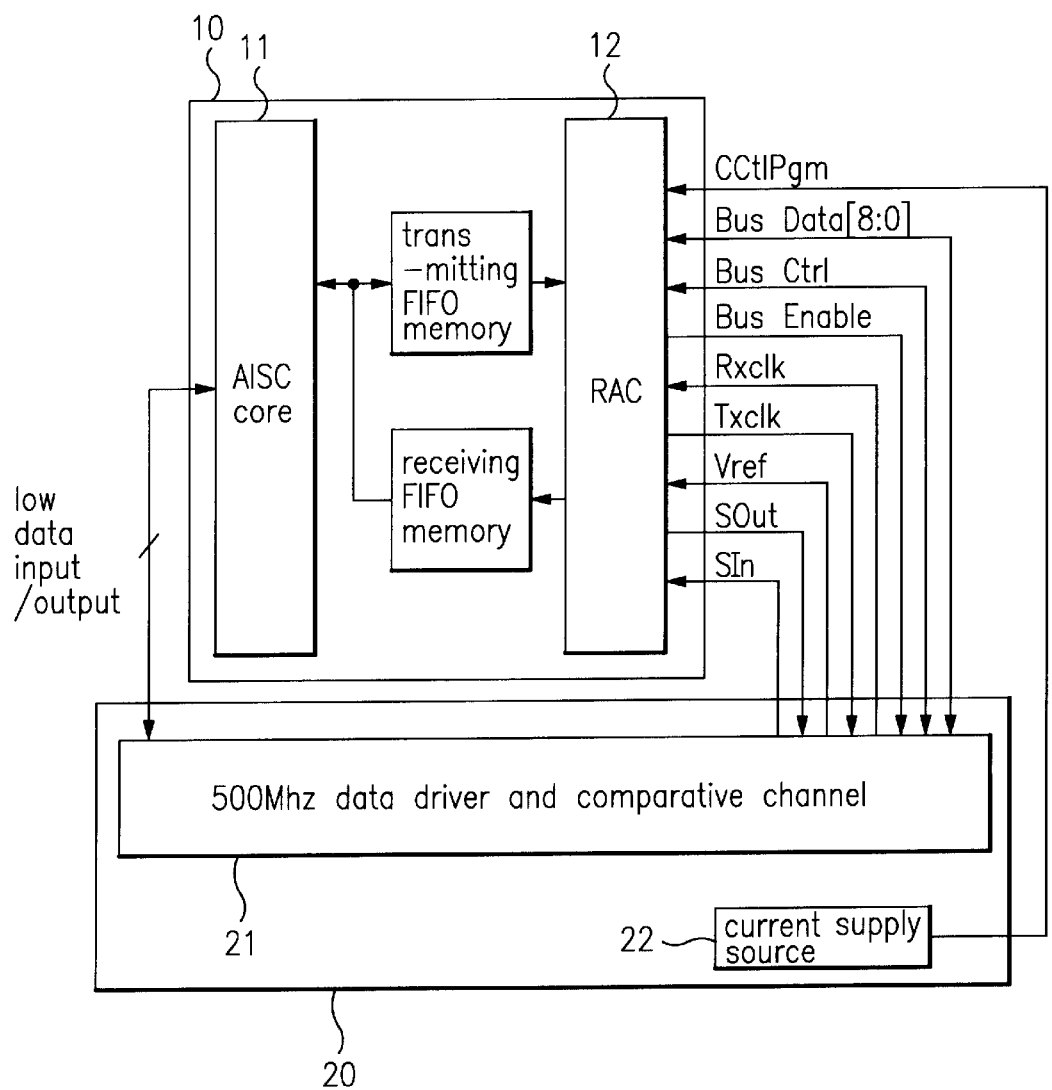
FIG. 2 is a schematic of a conventional Rambus ASIC chip and a testing circuit.
Figure 3:
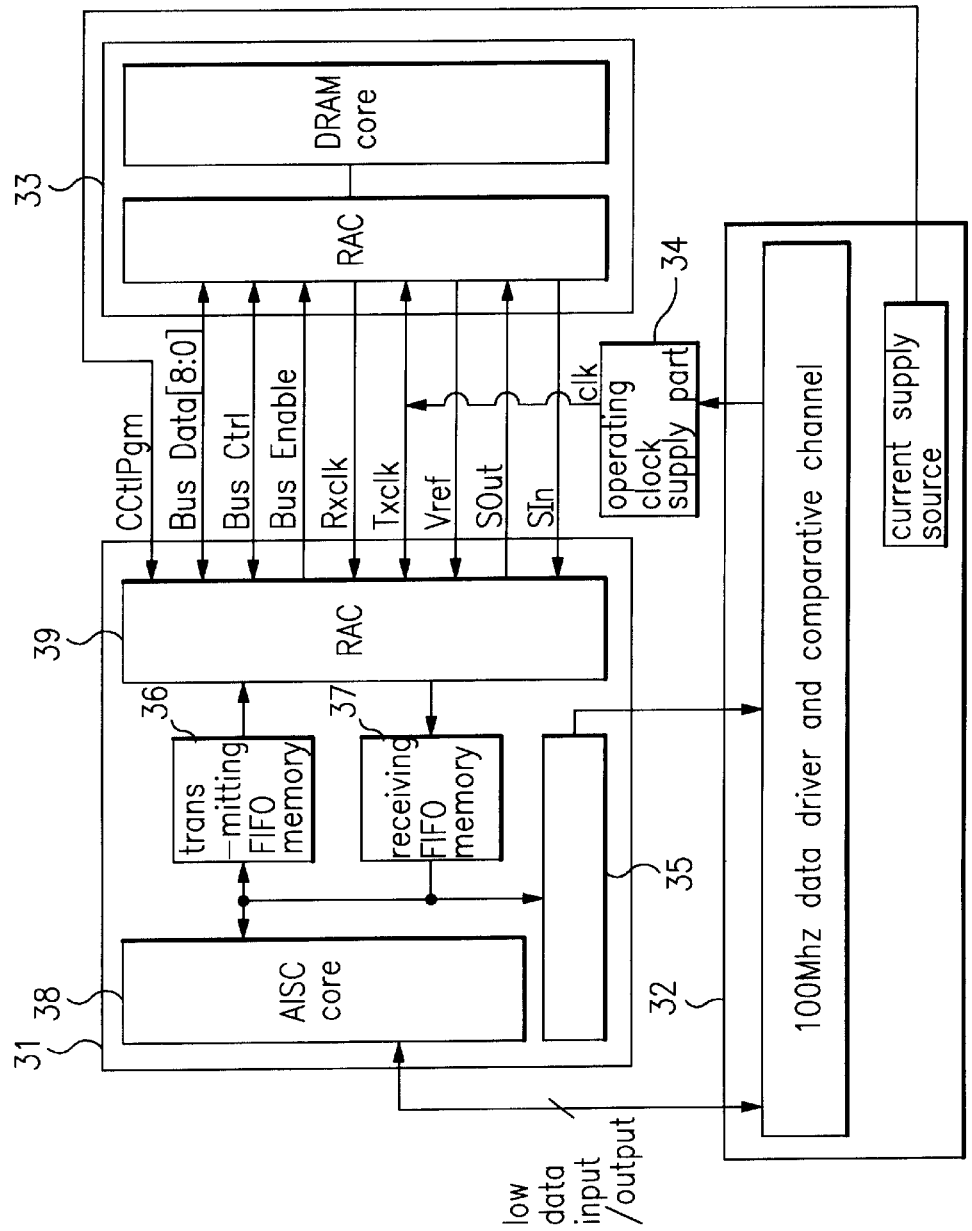
FIG. 3 is a schematic of a Rambus ASIC chip and a testing circuit according to the present invention.

Reference will now be made in detail to the preferred embodiments of the present invention, examples of which are illustrated in the accompanying drawings.

In the present invention, it is intended to efficiently test high speed data input/output function of master devices of a Rambus memory system consisting of a master device, a slave device, and a Rambus channel which connects the master device with the slave device.

In other words, in the present invention, there is provided a test logic part 35 in a Rambus ASIC chip to facilitate the operation test.

The Rambus ASIC according to the present invention comprises a Rambus ASIC chip 31 constituting a master device, which includes a test logic part 35, a Rambus DRAM 33 consisting of a slave device, a test comparator 32 for driving or comparing data at a speed of 100MHz through each I/O pin in the Rambus ASIC chip 31.

The Rambus ASIC further comprises an operating clock supply part 34 for supplying an operating clock to an RAC 39 of the Rambus ASIC chip 31 by varying the operating clock between 250MHz and 350MHz under the control of the frequency of the test comparator 32.

The Rambus ASIC chip 31 further includes an ASIC core 38, a transmitting first-input and first-output (FIFO) memory 36, a receiving FIFO memory 37, and the RAC 39.

The transmitting FIFO memory 36 serves to first-input and first-output data through the RAC 39 when originally writing data in the Rambus DRAM 33. The receiving FIFO memory 37 serves to sequentially output data in the Rambus DRAM 33, which are read out through the RAC 39, to the ASIC core 38 to test input/output operation speed.

The detailed configuration of the test logic part 35 will be described with reference to FIG. 4.

Figure 4:
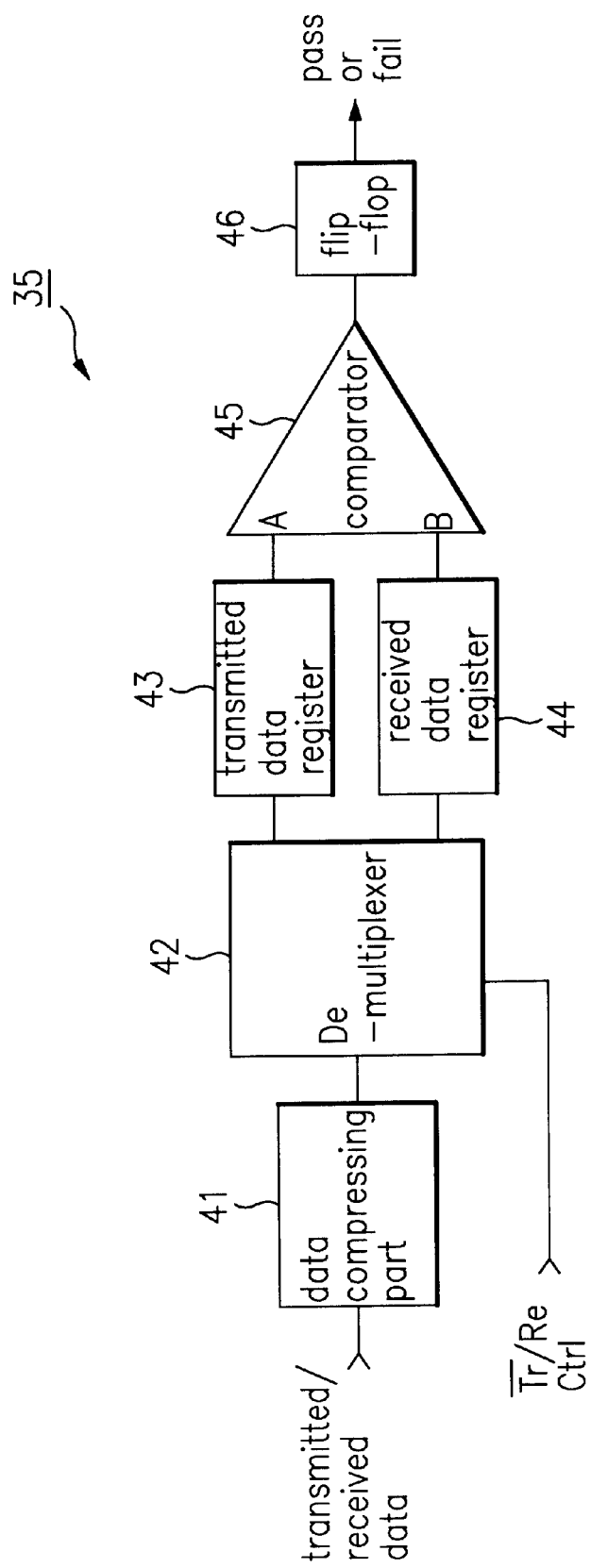
FIG. 4 is a schematic of a test logic part of a Rambus ASIC chip according to the preferred embodiment of the present invention.

As shown in FIG. 4, the test logic part 35 includes a data compressing part 41 for compressing transmitted data to originally write data in the Rambus DRAM and compressing the received data read out after being written in the Rambus DRAM 33, an demultiplexer 42 for demultiplexing the transmitted data and the received data compressed by the data compressing part 41, a transmitted data register 43 for storing the transmitted data output from the demultiplexer 42, a received data register 44 for storing the received data output from the demultiplexer 42, a comparator 45 for comparing the data from the transmitted data register 43 with the data from the received data register 44 and outputting a test signal for the data input/output operation, and a flip-flop 46 for latching the outputs from the comparator 45 and outputting a judgement signal for the data input/output operation test to the test comparator 32.

A testing method of the Rambus ASIC cell having the high speed test function will be described with reference to FIG. 5.

Figure 5:
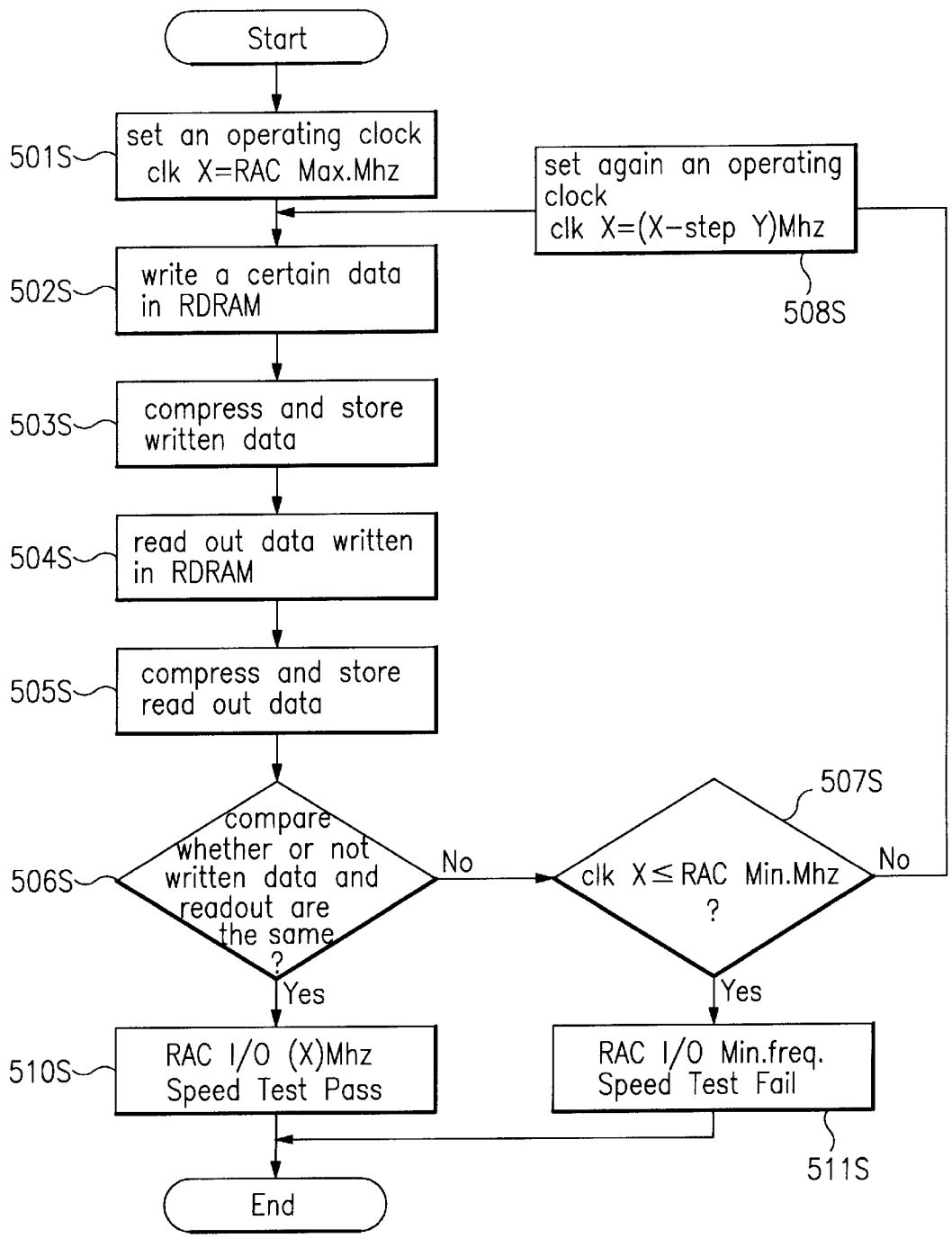
FIG. 5 is a flow chart illustrating a testing method of a Rambus ASIC chip according to the present invention.

As shown in FIG. 5, the clock of the operating clock supply part 34 is set to correspond to the maximum operating speed of the RAC 39 under the control of the test comparator 32 (clk=RAC Max.Mhz) (501S).

A certain data is written in the slave device, i.e., Rambus DRAM 33 (502S). The written data is compressed and then stored in the transmitted data register 43 of the test logic part 35 (503S).

Subsequently, the data written in the Rambus DRAM 33 is read out again (504S). The read data is compressed and then stored in the received data register 44 of the test logic part 35 (505S).

The data stored in the transmitted data register 43 and the data stored in the received data register 44 are compared with each other by the comparator 45 (506S).

It is determined that the data input/output operation through the RAC 39 is normal if the data values in the registers 43 and 44 are the same (510S).

On the other hand, if the data values in the registers 43 and 44 are not the same, the above testing steps repeat by lowering the clock frequency of the operating clock supply part 34 to a certain level until the data values in the registers 43 and 44 are the same (507S) (508S).

Finally, if the data values in the registers 43 and 44 are not the same, and the clock frequency of the operating clock frequency of the operating clock supply part 34 is belows a certain level which disables the function of the operating clock supply part 34, for exaple, when the clock frequency becomes zero, RAC I/O Min. freq speed Test goes to fail. (507S) (511S)

The operation speed test of the Rambus ASIC cell enables the high speed RAC test of 500Mhz or greater using the low speed test comparator.

The Rambus ASIC having a high speed testing function and the testing method thereof have the following advantages.

First, since it is possible to test the Rambus ASIC chips having data input/output speed of 500Mhz or greater using the low speed test comparator, the test cost in mass production is reduced.

Second, since full speed test can be performed under the actual Rambus memory application condition regardless of the RAC speed development, application of the test equipment can be improved in the actual mass production.

Finally, since the test can be performed regardless of the RAC speed, the final user can efficiently perform the RAC test of the ASIC chip.

It will be apparent to those skilled in the art that various modifications and variations can be made in the Rambus ASIC having a high speed testing function and the testing method thereof according to the present invention without departing from the spirit or scope of the invention. Thus, it is intended that the present invention covers the modifications and variations of the invention provided they come within the scope of the appended claims and their equivalents.

What is claimed is:

1. A Rambus ASIC having a high speed testing function comprising:

a Rambus ASIC chip constituting a master device, which includes an RAC having at least one I/O pin with a first data input/output speed based on an operating clock;

a Rambus DRAM constituting a slave device;

a test comparator that drives or compares data at a second speed, which is lower than the first data input/output speed through said at least one I/O pin in the RAC in the Rambus ASIC chip, for testing data input/output operations at the first data input/output speed;

an operating clock supply part that supplies the operating clock to the RAC of the Rambus ASIC chip by varying the operating clock in data writing and reading under the control of the frequency of the test comparator; and a test logic part in the Rambus ASIC chip that outputs data judgement signals to the test comparator.

2. The Rambus ASIC having a high speed testing function as claimed in claim 1, wherein the test comparator drives or compares the data at the second speed of 100MHz.

3. The Rambus ASIC having a high speed testing function as claimed in claim 1, wherein the test comparator includes a low speed input/output data driver and comparative channel, and a current supply source for supplying a current to the Rambus ASIC chip.

4. The Rambus ASIC having a high speed testing function as claimed in claim 1, wherein the test logic part includes:

a data compressor that compresses data transmitted as write data in the Rambus DRAM and compresses received data read out after being written in the Rambus DRAM;

an demultiplexer that demultiplexes the transmitted data and the received data compressed by the data compressor;

a transmitted data register that stores the transmitted data output from the demultiplexer;

a received data register that stores the received data output from the demultiplexer;

a comparator that compares the compressed data from the transmitted data register with the compressed data from the received data register and outputs a test signal for the data input/output operation; and a flip-flop that latches the outputs from the comparator and outputs a judgement signal for the data input/output operation test to the test comparator.

5. The Rambus ASIC having a high speed testing function of claim 1, wherein the first data input/output speed is an operational speed of said at least one I/O pin.

6. The Rambus ASIC having a high speed testing function of claim 5, wherein the operational speed is 500MHz and the second speed is 100MHz.

7. The Rambus ASIC having a high speed testing function of claim 1, wherein the first data input/output speed is 500MHz.

8. The Rambus ASIC having a high speed testing function of claim 1, wherein if the data judgement signals are test fail, the operating clock supply part reduces the operating clock speed to reduce the first data input/output speed by a prescribed amount.

9. A testing method of a Rambus ASIC having a high speed testing function comprising:

setting an operating clock to correspond to the maximum input/output operation speed of an RAC under the control of a test comparator;

driving or comparing data using a test comparator operating at a second speed lower than the maximum input/output operation speed of the RAC to supply prescribed data;

writing the prescribed data in a slave device and compressing the prescribed data to store in a test logic part;

reading out the data written in the slave device and compressing the data to store in the test logic part;

comparing the written data stored in the test logic part with the read out data stored in the test logic part;

determining normal data input/output through the RAC if the two data values stored in the test logic part are the same;

repeating said testing steps by lowering the clock frequency of a clock supply part by a prescribed amount until the two data values stored in the test logic part are the same; and outputting test fail when the clock frequency of the clock supply part is below a predetermined level.

10. The method of claim 9, wherein the maximum input/output operation speed is an operational speed of an I/O pin of the RAC.

11. The method of claim 10, wherein the maximum input/output operation speed is 500MHz and the second speed is 100MHz.

12. The Rambus ASIC, comprising:

a Rambus ASIC chip constituting a master device, which includes an RAC with at least one I/O pin with a first data input/output speed;

a Rambus DRAM constituting a slave device;

a test comparator that drives or compares data at a second speed, which is lower than the first data input/output speed, in the Rambus ASIC chip, wherein the test comparator is adapted to test operations of the at least one RAC I/O pin at the first data input/output speed;

a test logic part in the Rambus ASIC chip that outputs a data judgement signal to the test comparator.

13. The Rambus ASIC of claim 12, further comprising an operating clock supply part that supplies an operating clock to the RAC of the Rambus ASIC chip by varying the operating clock in data writing and reading under the control of the frequency of the test comparator, wherein if the data judgement signals are test fail, the operating clock supply part reduces the operating clock speed to reduce the first data input/output speed by a prescribed amount, and wherein if the first data input/output falls below a prescribed clock speed, the test comparator stops the test.

14. The Rambus ASIC of claim 12, wherein the test logic part comprises:

a data compressor that compresses data that is also transmitted for writing in the Rambus DRAM and that compresses received data read out after being written in the Rambus DRAM;

a selector that selects the transmitted data and the received data compressed by the data compressor; and a comparator circuit coupled to the selector that compares the transmitted data and the received data compressed by the data compressor and outputs the data judgement signal for the data input/output operation test to the test comparator.

15. The Rambus ASIC of claim 14, wherein the test logic part further comprises:

a transmitted data register that stores the transmitted data output from the selector; and a received data register that stores the received data output from the selector, wherein the comparator circuit comprises, a comparator that compares the compressed data from the transmitted data register with the compressed data from the received data register and outputs a test signal for the data input/output operation, and a flip-flop that latches the outputs from the comparator and outputs the data judgement signal for the data input/output operation test to the test comparator.

* * * * *